US008652974B2

(12) United States Patent
Piwczyk

(10) Patent No.: US 8,652,974 B2
(45) Date of Patent: Feb. 18, 2014

(54) METHOD AND SYSTEM FOR PRE-HEATING OF SEMICONDUCTOR MATERIAL FOR LASER ANNEALING AND GAS IMMERSION LASER DOPING

(75) Inventor: Bernhard Piwczyk, Dunbarton, NH (US)

(73) Assignee: IPG Photonics Corporation, Oxford, MA (US)

( * ) Notice: Subject to any disclaimer, the term of this patent is extended or adjusted under 35 U.S.C. 154(b) by 314 days.

(21) Appl. No.: 13/166,227

(22) Filed: Jun. 22, 2011

(65) Prior Publication Data

US 2012/0329288 A1    Dec. 27, 2012

(51) Int. Cl.
*H01L 21/268* (2006.01)
(52) U.S. Cl.
USPC . 438/795; 438/799; 219/121.65; 219/121.74; 257/E21.347
(58) Field of Classification Search
USPC ............... 438/795, 799; 219/121.65, 121.74
See application file for complete search history.

(56) References Cited

U.S. PATENT DOCUMENTS

| 5,885,904 | A | 3/1999 | Mehta et al. | |
|---|---|---|---|---|
| 6,632,729 | B1 * | 10/2003 | Paton | 438/535 |
| 7,148,159 | B2 * | 12/2006 | Talwar et al. | 438/795 |
| 8,003,498 | B2 * | 8/2011 | England et al. | 438/486 |
| 2006/0252282 | A1 | 11/2006 | Talwar et al. | |
| 2008/0264910 | A1 | 10/2008 | Kashyap et al. | |

FOREIGN PATENT DOCUMENTS

WO     2011066548 A1     6/2011

OTHER PUBLICATIONS

International Search Report, dated Jan. 21, 2013.

* cited by examiner

*Primary Examiner* — Alexander Ghyka
(74) *Attorney, Agent, or Firm* — Yuri Kateshov; Timothy J. King

(57) ABSTRACT

A fiber laser system enables a method for treating a semiconductor material by preheating a wafer for laser annealing and gas immersion laser doping by a laser source. A long wave length fiber laser having a Gaussian or similar profile is applied in a full-width ribbon beam across an incident wafer. Preferably the wavelength is greater than 1 μm (micron) and preferably a Yb doped fiber laser is used. The process is performed in a suitable environment which may include doping species. The process ensures the temperature gradient arising during processing does not exceed a value that results in fracture of the wafer while also reducing the amount of laser radiation required to achieve controlled surface melting, recrystallization and cooling.

9 Claims, 2 Drawing Sheets

METHOD AND SYSTEM FOR PRE-HEATING OF SEMICONDUCTOR MATERIAL FOR LASER ANNEALING AND GAS IMMERSION LASER DOPING

BACKGROUND OF THE INVENTION

1. Field of the Invention

The present invention relates to a method and system for treating a semiconductor material. More specifically, the present invention relates to a method and system for preheating a semiconductor material and reducing the amount of laser radiation required to achieve downstream surface melting on at least one side while also enabling controlled recrystallization and cooling.

2. Description of the Related Art

The ion implantation process, which introduces impurity atoms or dopants into surface region of a semiconductor wafer leaves dopant atoms in interstitial sites where they electronically inactive. In order to move the dopant atoms into substitutional sites in the lattice to render them active and otherwise to repair process damage an annealing of the surface region is performed by heating to high temperature, typically in a tube furnace or with a rapid thermal process (RPT) furnace.

The absorption depth of a given wavelength of light in a material decreases as temperature of the material increases. An example is the absorption of silicon as a function of temperature as is shown in FIG. 1, provided by Thomas R. Harris, "*Optical Properties of Si, Ge, GaAs, InAs, and InP at elevated Temperatures*, Thesis AFIT/GAP/ENP/10-M08, Air Force Institute of Technology, Wright-Patterson Air Force Base, Ohio, 2010 the contents of which are incorporated by reference, Also for review by the public is U.S. Pat. No. 7,494,942 and U.S. Pat. No. 7,399,945, the contents of which are also incorporated by reference.

Necessarily, for the purpose of annealing ion implanted semiconductor wafers having a crystal lattice structure using an JR laser, much of the laser radiation is used to heat the wafer to a point where most of the laser radiation is absorbed close to the surface of the wafer facing the incident beam (incident side). Ultimately the material reaches a temperature where most of the radiation is absorbed near the surface and a thin layer of the material near the surface melts further changing the absorption rate therein.

Conventionally, an incident laser beam impinges on only a tiny part of a wafer on an incident side at any moment in time resulting in substantial localized thermal gradients, localized large stress gradients, and wafer fracture.

The amount of incident laser radiation required to achieve surface melting can be significantly reduced if the wafer is preheated, prior to heating the surface to a higher desired melting temperature. There are several methods available for wafer preheating, including; conductive source heating via resistance, conduction from a susceptor heated by RF (Radio Frequency), and radiative heating by JR (Infra Red) light source (non-laser).

The process using ion implantation to generate a semiconductor junction provides for a two-step process; a first step of "ion implantation" at a specific ion energy and dose (so-called pre-deposition) and a second step of "annealing" (also drive-in diffusion). The later is performed in two ways: (A) heating of an ion-implanted wafer in a furnace to a temperature of >1000° C. for a time period of >0.50 hr (allowing implanted species to migrate), and (B) rapidly heating a surface of an implanted waver with a heat source (allowing rapid migration to active sites), often in a process called rapid thermal processing (RTP)).

In a process referred to as GILD (Gaseous Immersion Laser Doping), laser heating (surface melting) by laser energy when performed in an appropriate gaseous environment containing a desired doping species (including but not limited to Arsine ($AsH_3$), Phosphine ($PH_3$), and/or Boron Triflouride ($BF_3$) or others as is known in the art) was found to result in high quality semiconductor junctions and eliminated ion implantation and lowering capital equipment cost substantially. It was essential to the GILD process to employ short pulsed and short wavelengths lasers operating in the UV spectrum (Excimers). This was essential due to the short absorption depth of UV radiation in silicon.

Accordingly, there is a need for an improved method and system for preheating of semiconductor materials for laser annealing and gas immersion laser doping so that the amount of laser radiation required to achieve further processing is significantly reduced with enhanced processing economics. There is also a need to eliminate material fracture arising during localized heating by a scanned laser beam during processing.

ASPECTS AND SUMMARY OF THE INVENTION

In response it is now recognized that longer wavelength radiation above 1.0 microns (such as 1.06 and 10.2 microns) provided by a single fiber laser source (including, Yb-doped, $CO_2$, ruby, near IR lasers, or other doped high wavelength fibers, LEDs, or operative diode lasers or diode arrangements) operating at any operative power range, including above 100W, or above 1.0 kW, or more may be used for improved processing economics. Such processing may include preheating to temperatures over 400° C. and up to approximately 600° C., to create free carriers during preheating, or at higher temperatures to activate implanted doping atoms, or to anneal or to conduct GILD processes. Preheating may be done by a preheat beam derived from the same laser source as an exposing laser, through beam splitting or differently proportioned beams split by optics, or by providing a second laser source. It is now recognized that the preheating laser is not limited to the particular illustration here, but may be provided by any other suitable laser beam arrangement.

It is recognized that long wavelength radiation causes material heating thereby further changing the absorption depth of the radiation so that resulting surface melting has been largely neglected. If the material is undergoing melting at the surface in a partial vacuum containing a dopant gas the dopant will rapidly diffuse to the liquid solidus interface forming junctions down to the melt depth.

It is recognized that the temperature gradient arising during processing must not exceed a critical value that results in fracture or other damages within the crystal structure.

It is also now recognized that the use of a long wavelength in a ribbon beam having a width and a tailored Gaussian or similar profile can be scanned orthogonally to a long dimension of the ribbon over a full width of a wafer during a process, such that via the beam profile, the beam provides, respectively, a leading edge and a trailing edge, such that the distribution of radiation power (width and intensity of the profile) over a scan rate factor dictates a melt depth on an incident surface. See for example FIG. 2 which illustrates this profile concept. This treatment may be used to scan a complete wafer at a beam scanning rate of about 15 cm/sec., or more, to meet throughput requirements. This process may be used to treat a wafer of any dimension. This process may be used to control surface melting to a desired junction depth, for example 0.23 µm. If the wafer is preheated by some means other than the exposing laser, the magnitude of the temperature gradients can also be reduced and less laser power is required.

A fiber laser system enables a method for treating a semiconductor material by preheating, by annealing of an ion implanted wafer, or by GILD type wafer treatment. A longer wave length fiber laser having a Gaussian profile operating in any suitable mode is applied in a ribbon beam across an incident wafer. Preferably the laser wavelength is greater than 1 µm (micron) and preferably a Yb-doped fiber laser of multi kW is used. The method is performed in a gaseous environment which may further comprise a doping species.

An aspect of the present invention provides an improved method and system for preheating semiconductor material for laser annealing and gas immersion laser doping so that an amount of laser energy power is reduced and the temperature gradients are easily controlled.

The preheating steps may be performed in any suitable environment, including a fully evacuated, partial pressure, and/or over pressure environment. Where an atmosphere is employed, the atmosphere may be any suitable working atmosphere, including for example, a noble gas or non-reactive gas ($H_2$, $He_2$, $N_2$, Ar, etc.) or any combination or mixture of gases or any suitable doping species and/or any combination of dopant gases.

The above, and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
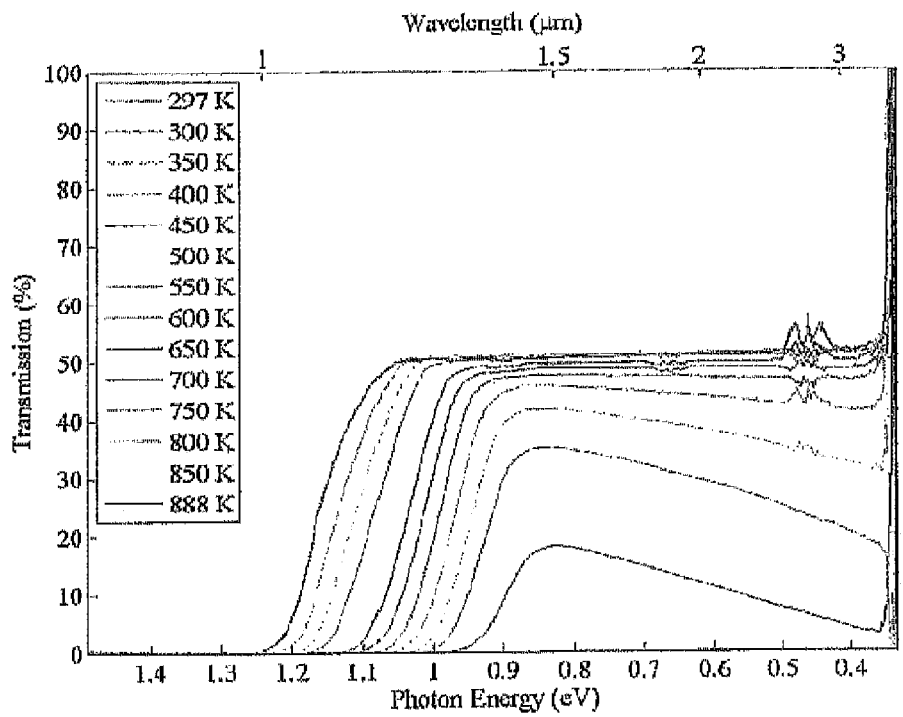
FIG. 1 is a graph of the infrared transmission of photon energy for Si as a function of temperature.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner.

It will also be recognized herein that various techniques of preheating a semiconductor material are recognized in the art, and may be optionally used in the proposed process, but are not required. These techniques include preheating by conduction from a heat source, heating by conduction from a susceptor heated by RF power, radiative heating by IR light sources other than a laser, such that the proposed process may be adapted to also include any of these preheating process easily without departing from the scope or spirit of the invention.

Any of the preheating methods can be applied, alone, in sequence, or simultaneously, to reduce the amount of laser power required for later final processing, annealing and/or GILD treatment and/or to reduce thermal stresses within the wafer.

Figure 3:
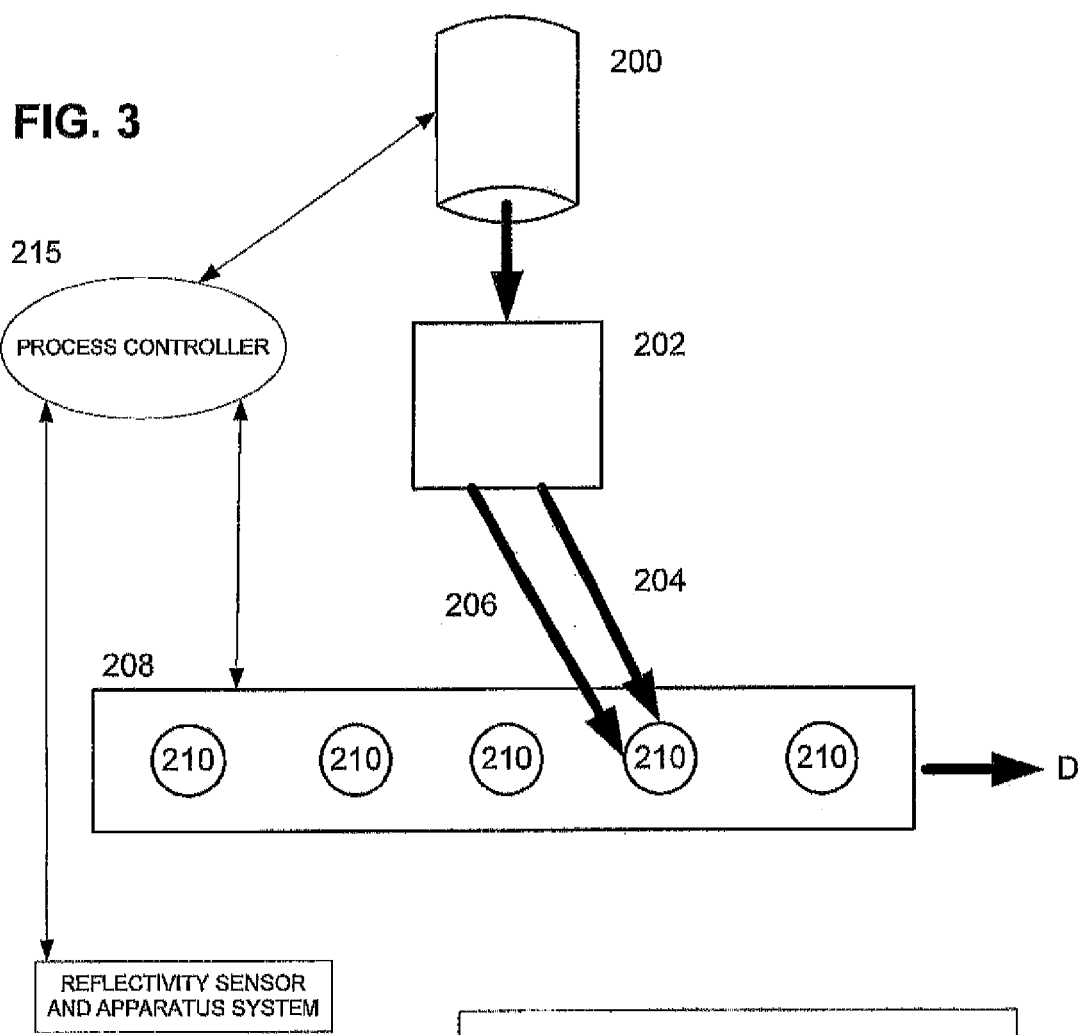
FIG. 3 is an exemplary process system for preheating, or treating, a semiconductor material.

FIG. 3 is a simplified exemplary system of an optional process flow of one alternative embodiment of the present invention. A laser source system 200 is selected based upon desired wavelength and Gaussian or similar profile, and could be any one of: an Yb fiber laser; a CW laser; or other known fiber laser suitable for the purpose. Laser source system 200 may be optionally any known laser source, including optionally fiber laser, disk lasers, gas lasers, or others known in the art. Laser source 200 may optionally include a square fiber, round fiber, or other laser diode sources, including operative laser system components including collimator optics, homogenizer optics, optics, and other elements known to those of skill in the art to generate a desired beam. The beam is directed to an optical splitter system 202 which splits the initial beam into a preheating beam 204 and a non-preheating process beam 206 for process annealing or GILD, etc. Optical splitter system 202 is quipped with suitable optics to both split the initial beam and optionally to selectively determine an intensity proportion of the split beam between preheat beam 204 and non-preheat or process beam 206.

Beam 204 can be utilized as an annealing pre-laser while beam 206 can also be directed to perform optionally, a second preheating step or the actual processing step. It is to be understood that the semiconductor material, shown as a wafer 210 is operative relative to a supporting system 208. Therefore, while one embodiment may involve preheating a semiconductor material a related process may vary by time and intensity (power), or beam profile (Gaussian or other profile) and may be used to further preheat (e.g., a second pre-heat), to anneal (following ion implantation). It will be recognized from this paragraph, that the teachings of the proposed invention may be adaptively employed to manage the preheating, melting, recrystallization, and cooling of a semiconductor material.

It will also be recognized, that optionally, beams 204, 206 may follow-each other in close proximity, even very close proximity, on a single wafer 210, possibly sufficiently close that the beam distribution profiles overlap.

Figure 2:
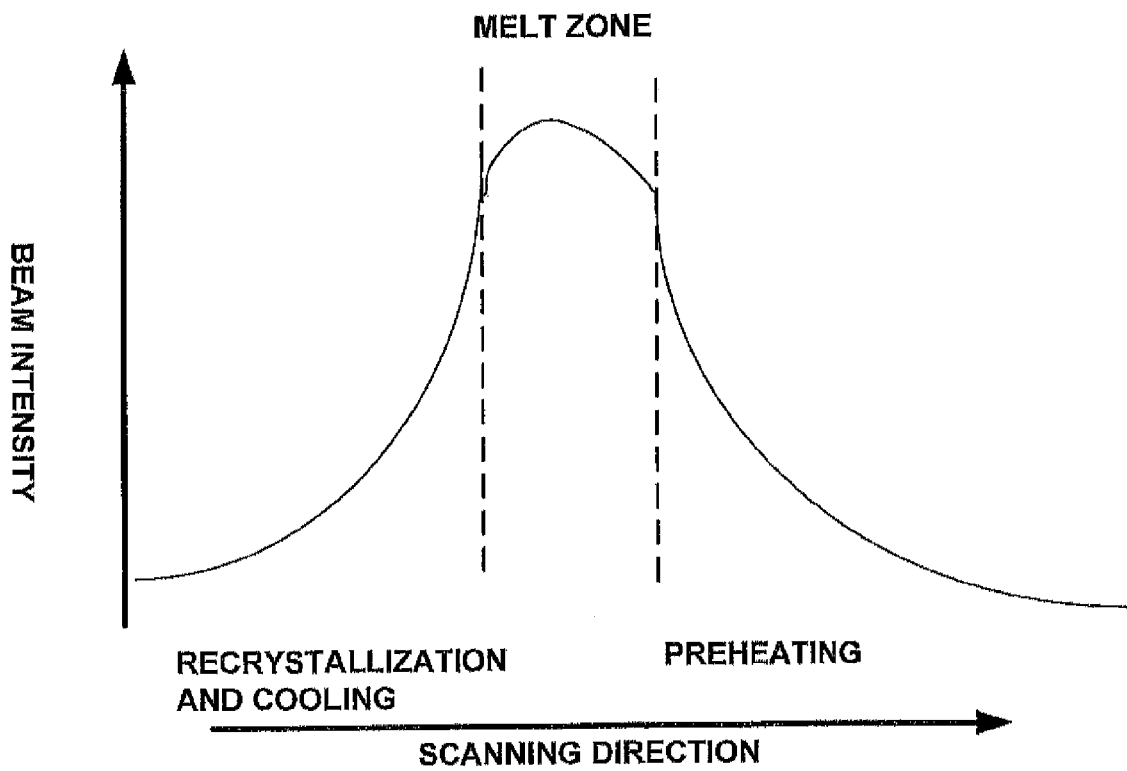
FIG. 2 is a graphical representation of a ribbon beam profile relative to a scan direction; e.g., preheating, melt zone, and recrystallization and cooling.

It will also be recognized, that alternatively and optionally, a single long wavelength beam having a suitable Gaussian or similar profile and formed into a ribbon form and scanned on wafer 210 orthogonal to a long dimension of the ribbon form may conduct both preheating and treating processing as noted in FIG. 2 in a single scan that extends beyond both wafer edges.

Supporting system 208 may be any operative moving stage system to process wafers 210 along direction D relative to beams 204, 206, or optionally a single beam as discussed in the above paragraph. Such an operative system may include an Electrostatic Chuck (not shown) for each wafer 210 with a gold or other reflective coating. Where a form of preheating uses diodes the preheating may be of high intensity and short exposure (resulting in partial-thickness heating) or longer treatment to provide uniform (isothermal) preheating through the thickness of the wafer, depending upon user preference. The electrostatic force attracts the wafer into immediate contact with the chuck thereby providing uniform temperature across the surface of the wafer after laser annealing.

A computerized process controller system 215 containing an operational process control program, memory systems, and process control (all not shown) is in operative communication with laser source system 200, laser beam processing optics and beam splitter system 202, an optional reflectivity measurement system apparatus 216 for measuring the reflectivity of reflected laser light for process control. Based upon readings from reflectivity measurement system apparatus 216, operative instructions may be issued by process controller 215 to vary a processing variable (speed, intensity, power, split ratio or otherwise).

Figure 4:
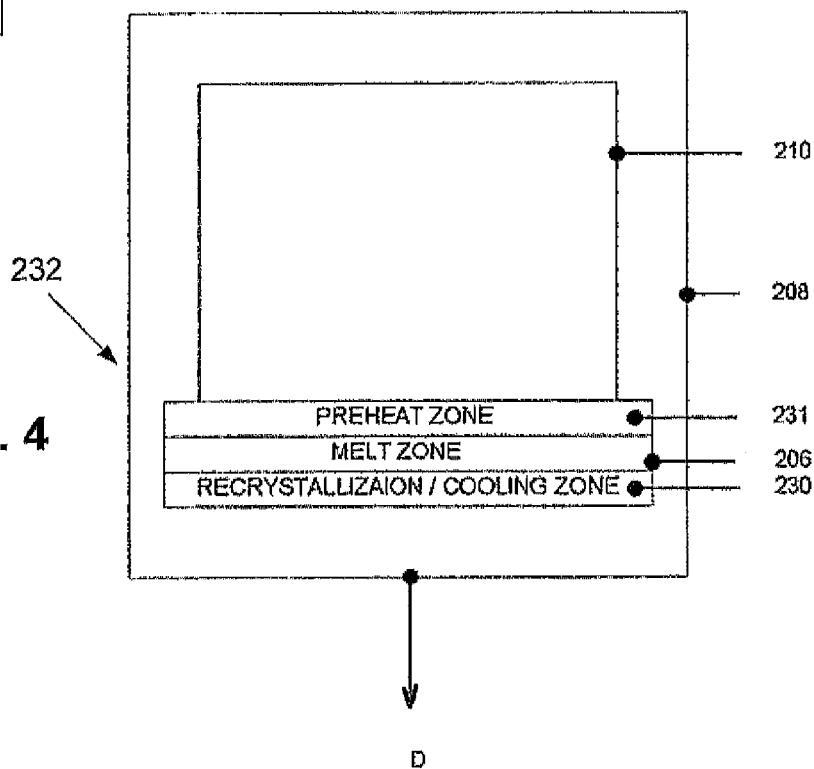
FIG. 4 is an exemplary process illustration.

Additionally referring now to FIG. 4 an illustrative treatment shown in situ (in an instant process moment), where a semiconductor material (wafer) 210 is supporting on supporting system 208 moving in direction D. This motion direction provides a leading edge 231 and a trailing edge 230 for wafer 210. Region 232 is a ribbon beam from preheating beam 204 (See FIG. 3) extending beyond both edges of the scanning direction of the wafer (normal to the narrow axis of the annealing laser beam of the wafer). The ribbon beam fully extends the width of wafer 210 before contacting and after full treatment. In this manner, there is a full scanning over the complete wafer to manage the temperature gradient during processing. It will be understood that optical splitter system 202 may contain optics sufficient to shape the beam to fully scan the wafer. It will be also understood that optical splitter system 202 may also operate to control an intensity ratio between the split beams so that preheating beam 204 operates a different intensity than processing beam 206 Similarly, controller 215 may provide different duration times of the split beams, and may also optionally be used to manage the Gaussian profile so that it may be expanded in the narrow direction of a ribbon beam to effect the temperature gradient for preheating and cooling of a surface.

It will also be understood by those of skill in the art that the preheating method and system discussed herein may employ laser diode preheating, laser diode or direct laser diode preheating, and laser beam preheating without departing from the scope herein, such that the use of the term laser preheating, laser diode and/or laser diode or direct laser diode may be adaptively used but readily understood within the scope of the disclosure. It is further understood, that based upon intensity and absorption factors, the thermal temperature during preheating or annealing/GILD treatment may be above 400° C.

Having described at least one of the preferred embodiments of the present invention with reference to the accompanying drawings, it will be apparent to those skills that the invention is not limited to those precise embodiments, and that various modifications and variations can be made in the presently disclosed method and system for preheating of semiconductor material for laser annealing and gas immersion laser doping without departing from the scope or spirit of the invention. Thus, it is intended that the present disclosure cover the modifications and variations of this disclosure provided they come within the scope of the appended claims and their equivalents.

What is claimed is:

1. A method for treating a substrate, comprising the steps of:
providing a single laser source operative to produce a first beam having a first profile, said profile being a generally Gaussian profile;
optically splitting said first beam to obtain at least one second ribbon beam;
forming said first beam into a first ribbon beam spanning a width of said substrate scanned orthogonal to a long dimension of said ribbon beam;
controllably directing said first and second ribbon beams onto at least one surface of said substrate in a gaseous environment so that the first ribbon beam preheats said substrate to a first temperature by applying a leading portion of said first profile of said first ribbon beam while said second beam heats said substrate to a desired temperature higher than said first temperature.

2. A method of treating a substrate, according to claim 1, further comprising the step of: melting a portion of said substrate by applying a central portion of said first profile of said ribbon beam to raise said surface temperature of said substrate above a liquidus transformation temperature thereof.

3. A method of treating a substrate, according to claim 2, further comprising the step of: cooling said portion of said substrate by applying a trailing portion of said first profile of said first ribbon beam sufficient to reduce said surface temperature of said substrate below said liquidus transformation temperature.

4. A method of treating a substrate, according to claim 3, wherein said first and second ribbon beams are a generally Gaussian profile and have a wavelength of at least 0.60 microns, said first beam preheating said substrate at a surface temperature of said substrate above 400° C.;
directing said second ribbon beam orthogonal to a long dimension of said substrate; and
said step of directing said second ribbon beam includes a step of applying, said second beam after the trailing portion of the first beam or overlapping a portion of said second ribbon beam on said first ribbon beam.

5. A method of treating a substrate, according to claim 4, wherein: said step of overlapping a portion of said second ribbon beam on said profile of said first ribbon beam further includes the step: overlapping at least one of said leading portion, said central portion, and said trailing portion of said first ribbon beam, thereby operably enabling said second ribbon beam to enhance respectively said one of said steps of preheating, melting, and cooling.

6. A method of treating a substrate, according to claim 5, wherein: said second beam is provided by at least one laser diode.

7. A method of treating a substrate, comprising the steps of:
providing a single laser source operative to produce a beam having a profile, said profile being a generally Gaussian profile and having a wavelength of at least 0.6 microns;
splitting said beam into a first beam and a second beam;
forming said first and second beams into respective first and second ribbon beams, each spanning a width of said substrate scanned orthogonal to a long dimension of said first and second ribbon beams;
directing said first ribbon beam incident onto at least one surface of said substrate in a gaseous environment;
directing said second ribbon beam incident onto said at least one surface of said substrate proximate said first ribbon beam; and
applying a respective leading portion of ones of said first and said second ribbon beams sufficiently to raise a surface temperature of said substrate to an intermediate temperature above 400° C.

8. A method, according to claim 7, further comprising the step of: applying a respective central portion of ones of said first and said second ribbon beams sufficient to raise said surface temperature of said substrate to a melting temperature thereof.

9. A method, according to claim 8, further comprising the step of applying a respective trailing portion of ones of said first and said second ribbon beams sufficient to cool said surface temperature of said substrate below said melting temperature thereof.

* * * * *